US011081441B1

(12) United States Patent
    Fu

(10) Patent No.: US 11,081,441 B1
(45) Date of Patent: Aug. 3, 2021

(54) CHIP ON FILM AND DISPLAY DEVICE

(71) Applicant: TCL China Star Optoelectronics Technology Co., Ltd., Shenzhen (CN)

(72) Inventor: Xiaoli Fu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 93 days.

(21) Appl. No.: 16/623,800

(22) PCT Filed: Dec. 5, 2019

(86) PCT No.: PCT/CN2019/123145
    § 371 (c)(1),
    (2) Date: Dec. 18, 2019

(87) PCT Pub. No.: WO2021/093053
    PCT Pub. Date: May 20, 2021

(51) Int. Cl.
    *H01L 23/498* (2006.01)

(52) U.S. Cl.
    CPC .............................. *H01L 23/49838* (2013.01)

(58) Field of Classification Search
    CPC .................................................. H01L 23/49838
    USPC ......................................................... 361/749
    See application file for complete search history.

(56) References Cited

U.S. PATENT DOCUMENTS

| 6,104,465 A * | 8/2000 | Na | G02F 1/1345 |
| | | | 349/152 |
| 6,879,367 B2 * | 4/2005 | Ukita | G02F 1/1345 |
| | | | 349/149 |
| 8,102,349 B2 * | 1/2012 | Ashizawa | G02F 1/13458 |
| | | | 345/92 |
| 8,421,980 B2 * | 4/2013 | Kim | G02F 1/1345 |
| | | | 349/152 |
| 2007/0216845 A1 * | 9/2007 | Liao | G02F 1/136286 |
| | | | 349/149 |
| 2011/0075089 A1 * | 3/2011 | Jheng | G09G 3/20 |
| | | | 349/152 |
| 2011/0235286 A1 | 9/2011 | Kitayama et al. | |
| 2014/0146253 A1 | 5/2014 | Lee et al. | |
| 2017/0184903 A1 | 6/2017 | Fujikawa | |
| 2020/0152120 A1 | 5/2020 | Li et al. | |

FOREIGN PATENT DOCUMENTS

| CN | 102246218 | 11/2011 |
| CN | 103839488 | 6/2014 |
| CN | 109461765 | 3/2019 |
| CN | 109976052 | 7/2019 |
| CN | 110134278 | 8/2019 |
| CN | 110139470 | 8/2019 |
| JP | 2017-120299 | 7/2017 |
| KR | 2018-0061856 | 6/2018 |

* cited by examiner

*Primary Examiner* — Sherman Ng

(57) ABSTRACT

The present application provides a chip on film and a display device, the chip on film including a plurality of first source signal lines located at a middle, and a plurality of second source signal lines located at opposite sides, wherein each of the first source signal lines has a cross-sectional area smaller than a cross-sectional area of each of the second source signal lines in a reference plane. Based on the structure, attenuation from the source driver chip to each data lines is substantially the same or even completely the same.

20 Claims, 2 Drawing Sheets

CHIP ON FILM AND DISPLAY DEVICE

RELATED APPLICATIONS

This application is a National Phase of PCT Patent Application No. PCT/CN2019/123145 having International filing date of Dec. 5, 2019, which claims the benefit of priority of Chinese Patent Application No. 201911111124.6 filed on Nov. 14, 2019. The contents of the above applications are all incorporated by reference as if fully set forth herein in their entirety.

FIELD AND BACKGROUND OF THE INVENTION

The present application relates to a field of display, and in particular to a chip on film and a display device.

A display panel has a display area and a non-display area, and the non-display area is provided with a fan-out area and a bonding area, and fan-out traces in the fan-out area are connected to the data lines of the pixels in the display area and source conversion terminals in the bonding area. However, the fan-out traces in the fan-out area have different lengths. Specifically, the fan-out traces at middle of the fan-out area are relatively short, and the fan-out traces at opposite sides of the fan-out area are relatively long. Since the fan-out traces have a same cross-sectional area, resistances of the fan-out traces at the opposite sides are larger than that of the fan-out traces resistance at the middle, such that the fan-out traces of the signals at the opposite sides are attenuated severely, eventually resulting in a serious undercharging of the pixels connected to the fan-out traces at the opposite sides compared with the pixels connected to the fan-out traces at the middle, visually expressed as a color shift.

That is, in the prior art, there are technical problems of difference in charging of the pixels at different positions in the display area due to difference in lengths of the fan-out traces in the fan-out area.

SUMMARY OF THE INVENTION

The present application provides a chip on film and a display device to alleviate the technical problems in the prior art that charging of the pixels at different positions in the display area is different, due to difference in lengths of the fan-out traces in the fan-out area.

To solve the above problems, technical solutions provided by the present application are as follows:

An embodiment of the present application provides a chip on film, which includes:

a substrate;

source driving chips disposed on the substrate and including source driving terminals;

source connection terminals disposed in a one-to-one correspondence with the source driving terminals; and source signal lines connecting the source connection terminals and the source driving terminals, wherein the source signal lines include a plurality of first source signal lines located at a middle, and a plurality of second source signal lines located at opposite sides, wherein each of the first source signal lines has a cross-sectional area smaller than a cross-sectional area of each of the second source signal lines in a reference plane, and the reference plane is perpendicular to the substrate and parallel to an arrangement direction of the source connection terminals.

In the chip on film provided in an embodiment of the present application, the plurality of first source signal lines have different cross-sectional areas in the reference plane, which gradually increase in a direction from the middle to the opposite sides.

In the chip on film provided in an embodiment of the present application, the plurality of first source signal lines have a same cross-sectional area in the reference plane.

In the chip on film provided in an embodiment of the present application, the plurality of second source signal lines have different cross-sectional areas in the reference plane, which gradually increase in a direction from the middle to the opposite sides.

In the chip on film provided in an embodiment of the present application, the plurality of second source signal lines have a same cross-sectional area in the reference plane.

In the chip on film provided in an embodiment of the present application, a cross-sectional area of each of the first source signal lines remain constant from its one end to another end.

In the chip on film provided in an embodiment of the present application, a cross-sectional area of each of the second source signal lines gradually decreases from its one end to another end.

In the chip on film provided in an embodiment of the present application, in the reference plane, a cross section of each of the first source signal lines is a first rectangle, a cross section of each of the second source signal lines is a second rectangle, and an area of the first rectangle is smaller than an area of the second rectangle.

In the chip on film provided in an embodiment of the present application, a length of a bottom edge of the first rectangle is smaller than a length of a bottom edge of the second rectangle, and/or a width of the first rectangle is smaller than a width of the second rectangle.

In the chip on film provided in an embodiment of the present application, in the reference plane, a cross section of each of the first source signal lines is a first trapezoid, a cross section of each of the second source signal lines is a second trapezoid, and the first trapezoid has an area smaller than an area of the second trapezoid.

In the chip on film provided in an embodiment of the present application, a length of a bottom edge of the first trapezoid is smaller than a length of a bottom edge of the second trapezoid, and/or a length of a top edge of the first trapezoid is smaller than a length of a top edge of the second trapezoid, and/or a height of the first trapezoid is less than a height of the second trapezoid.

In the chip on film provided in an embodiment of the present application, in the reference plane, a cross section of each of the first source signal lines is a third trapezoid, a cross section of each of the second source signal lines is a third rectangle, and an area of the third trapezoid is smaller than an area of the third rectangle.

In the chip on film provided in an embodiment of the present application, a half of a sum of a length of a bottom edge and a top edge of the third trapezoid is smaller than a length of a bottom edge of the third rectangle, and/or a height of the third trapezoid is smaller than a height of the third rectangle.

Meanwhile, an embodiment of the present application further provides a display device, including:

a display panel including fan-out traces and source switching terminals, and the fan-out traces include a plurality of first fan-out traces located at a middle, and a plurality of second fan-out traces located at opposite sides, wherein the source switching terminals include first source switching terminals connected to the first fan-out traces and second source switching terminals connected to the second fan-out traces, and a length of each of the first fan-out traces is smaller than a length of each of the second fan-out traces;

a chip on film including source signal lines and source connection terminals, the source signal lines including a plurality of first source signal lines located at a middle, and a plurality of second source signal lines located at opposite sides, wherein the source connection terminals includes first source connection terminals connected to the first source signal lines and second source connection terminals connected to the second source signal lines; the first source signal lines are electrically connected to the first fan-out traces through the first source connection terminals and the first source conversion terminals; and the second source signal lines are electrically connected to the second fan-out traces through the second source connection terminals and the second source conversion terminals, wherein each of the first source signal lines has a cross-sectional area smaller than a cross-sectional area of each of the second source signal lines in a reference plane, and the reference plane is perpendicular to the substrate and parallel to an arrangement direction of the source connection terminals.

In the display device provided by an embodiment of the present application, the plurality of first source signal lines have different cross-sectional areas in the reference plane, which gradually increase in a direction from the middle to the opposite sides.

In the display device provided by an embodiment of the present application, the plurality of first source signal lines have a same cross-sectional area in the reference plane.

In the display device provided by an embodiment of the present application, the plurality of second source signal lines have different cross-sectional areas in the reference plane, which gradually increase in a direction from the middle to the opposite sides.

In the display device provided by an embodiment of the present application, the plurality of second source signal lines have a same cross-sectional area in the reference plane.

In the display device provided by an embodiment of the present application, a sum of a resistance of each of the first source signal lines and a resistance of each of the first fan-out traces is equal to a sum of a resistance of each of the second source signal lines and a resistance of each of the second fan-out traces.

In the display device provided by an embodiment of the present application, a cross-sectional area of each of the second source signal lines gradually decreases from its one end to another end.

Beneficial effects of the present application are as follows: the present application provides a novel chip on film and display device, the chip on film includes a substrate; source driving chips disposed on the substrate and including source driving terminals; source connection terminals disposed in a one-to-one correspondence with the source driving terminals; and source signal lines connecting the source connection terminals and the source driving terminals, wherein the source signal lines include a plurality of first source signal lines located at a middle, and a plurality of second source signal lines located at opposite sides, wherein each of the first source signal lines has a cross-sectional area smaller than a cross-sectional area of each of the second source signal lines in a reference plane. Based on the structure, a resistance of the source signal line is greater than a resistance of the second source signal line. Accordingly, after the chip on film is bonded to the display panel to form a display module, the first source signal lines are connected to the first fan-out traces at the middle, and the second source signal lines are connected to the second fan-out traces at opposite sides, so that attenuation from the source driver chip to each data lines is substantially the same or even completely the same, which alleviates the technical problems in the prior art that charging of the pixels at different positions in the display area is different, due to difference in lengths of the fan-out traces in the fan-out area.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present application can alleviate the technical problems in the prior art that charging of the pixels at different positions in the display area is different, due to difference in lengths of the fan-out traces in the fan-out area.

Figure 1:
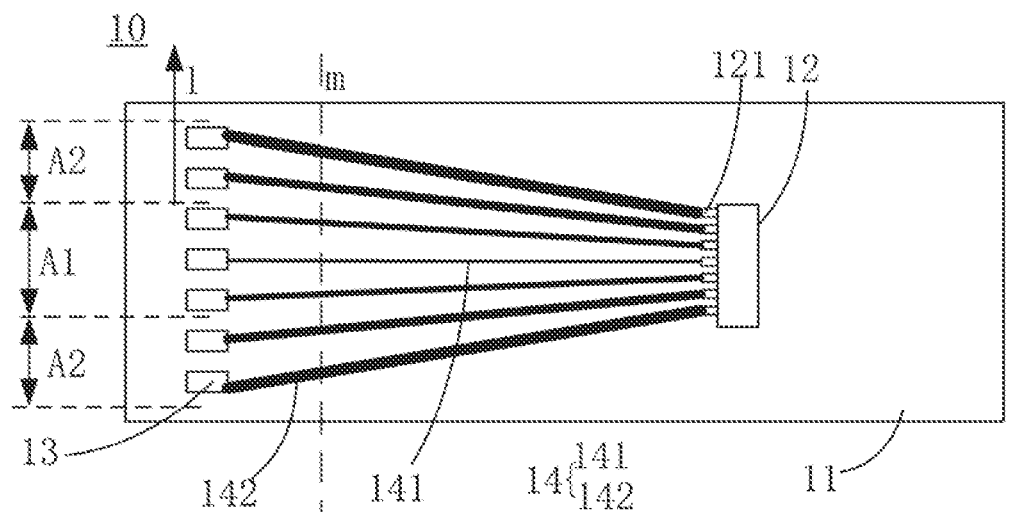
FIG. 1 is a schematic structural view of a chip on film provided by the present application.
Figure 2:
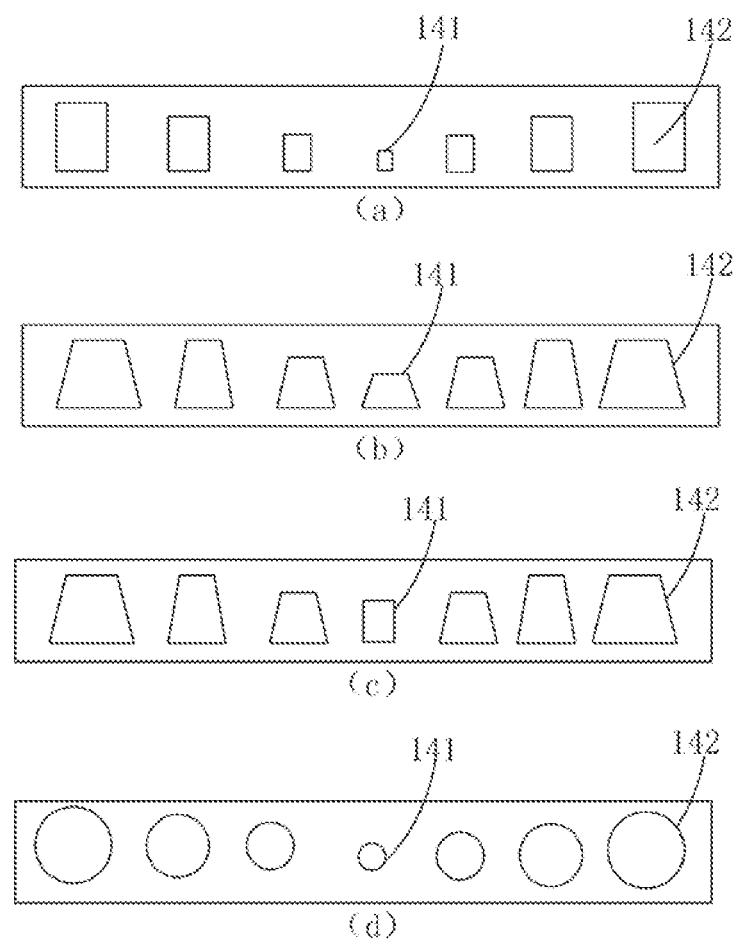
FIG. 2 is a schematic cross-sectional view of a chip on film provided by the present application.

In an embodiment, as shown in FIG. 1 and FIG. 2, the chip on film 10 provided by an embodiment of the present application includes:

a substrate 11;

source driving chips disposed 12 on the substrate 11 and including source driving terminals 121;

source connection terminals 13 disposed in a one-to-one correspondence with the source driving terminals 121; and source signal lines 14 connecting the source connection terminals 13 and the source driving terminals 121, wherein the source signal lines 14 include a plurality of first source signal lines 141 located at a middle A1, and a plurality of second source signal lines 142 located at opposite sides A2, wherein each of the first source signal lines 141 has a cross-sectional area smaller than a cross-sectional area of each of the second source signal lines 142 in a reference plane m, and the reference plane m is perpendicular to the substrate 11 and parallel to an arrangement direction 1 of the source connection terminals 13

In an embodiment of the present application, sizes of the middle A1 and the opposite sides A2 may be set as needed.

For example, in an embodiment, as shown in FIG. 1, the middle A1 includes three source connection terminals 13, and each of the opposite sides A2 includes one half of the remaining source connection terminals 13, that is, each of the opposite sides A2 includes two source connection terminals 13. In another embodiment, the middle A1 includes one source connection terminal 13, and each of the opposite sides A2 includes one half of the remaining source connection terminals 13, that is, each of the opposite sides A2 includes three source connection terminals 13.

In an embodiment of the present application, a number of the opposite sides A2 may be greater than two, that is, the same side of the middle A1 may include at least two opposite sides A2. In an embodiment, each of the regions (including the middle or opposite sides) includes only one source connection terminal.

In an embodiment of the present application, the first source signal lines 141 located at the middle A1 refer to the source signal lines 14 connected to the source connection terminals 13 at the middle A1, and the second source signal lines 142 located at the opposite sides A2 refer to the source signal lines 14 that connect the source connection terminals 13 located at the opposite sides A2.

This embodiment provides a chip on film, and the chip on film includes a substrate; source driving chips disposed on the substrate and including source driving terminals; source connection terminals disposed in a one-to-one correspondence with the source driving terminals; and source signal lines connecting the source connection terminals and the source driving terminals, wherein the source signal lines include a plurality of first source signal lines located at a middle, and a plurality of second source signal lines located at opposite sides, wherein each of the first source signal lines has a cross-sectional area smaller than a cross-sectional area of each of the second source signal lines in a reference plane. Based on the structure, a resistance of the source signal line is greater than a resistance of the second source signal line. Accordingly, after the chip on film is bonded to the display panel to form a display module, the first source signal lines are connected to the first fan-out traces at the middle, and the second source signal lines are connected to the second fan-out traces at opposite sides, so that attenuation from the source driver chip to each data lines is substantially the same or even completely the same, which alleviates the technical problems in the prior art that charging of the pixels at different positions in the display area is different, due to difference in lengths of the fan-out traces in the fan-out area.

In an embodiment, as shown in FIG. 1, the first source signal lines 141 have a same cross-sectional area from its one end to another end.

In an embodiment, cross-sectional areas of the second source signal lines gradually decrease in a direction from its one end to another end, for example, proportionally decrease.

In an embodiment, as shown in FIG. 1, in the reference plane, the cross-sectional areas of the plurality of first source signal lines are different, and gradually increase in a direction from the middle to the opposite sides.

In an embodiment, in the reference plane, the cross-sectional areas of the plurality of first source signal lines are the same.

In an embodiment, as shown in FIG. 1, in the reference plane, the cross-sectional areas of the plurality of second source signal lines are different, and gradually increase in the direction from the middle to the opposite sides.

In an embodiment, in the reference plane, the cross-sectional areas of the plurality of second source signal lines are the same.

In an embodiment, as shown by the reference symbol (a) in FIG. 2, in the reference plane, a cross section of each of the first source signal lines 141 is a first rectangle, a cross section of each of the second source signal lines 142 is a second rectangle, and an area of the first rectangle is smaller than an area of the second rectangle. In this embodiment, each of the source signal lines having a rectangular cross section is used to reduce the design difficulty of the source signal lines.

In an embodiment, as shown by the reference symbol (a) in FIG. 2, a length of a bottom edge of the first rectangle is smaller than a length of a bottom edge of the second rectangle, and/or a width of the first rectangle is smaller than a width of the second rectangle.

In an embodiment, as shown by the reference symbol (b) in FIG. 2, in the reference plane, a cross section of each of the first source signal lines 141 is a first trapezoid, a cross section of each of the second source signal lines 142 is a second trapezoid, and the first trapezoid has an area smaller than an area of the second trapezoid.

In an embodiment, as shown by the reference symbol (b) in FIG. 2, a length of a bottom edge of the first trapezoid is smaller than a length of a bottom edge of the second trapezoid, and/or a length of a top edge of the first trapezoid is smaller than a length of a top edge of the second trapezoid, and/or a height of the first trapezoid is less than a height of the second trapezoid.

In an embodiment, as shown by the reference symbol (c) in FIG. 2, in the reference plane, a cross section of each of the first source signal lines 141 is a third trapezoid, a cross section of each of the second source signal lines 142 is a third rectangle, and an area of the third trapezoid is smaller than an area of the third rectangle.

In an embodiment, as shown by the reference symbol (c) in FIG. 2, a half of a sum of a length of a bottom edge and a top edge of the third trapezoid is smaller than a length of a bottom edge of the third rectangle, and/or a height of the third trapezoid is smaller than a height of the third rectangle.

In an embodiment, as shown by the reference symbol (d) in FIG. 2, in the reference plane, a cross section of each of the first source signal lines 141 is a first circle, a cross section of each of the second source signal lines 142 is a second circle, and an area of the first circle is smaller than an area of the second circle.

Figure 3:
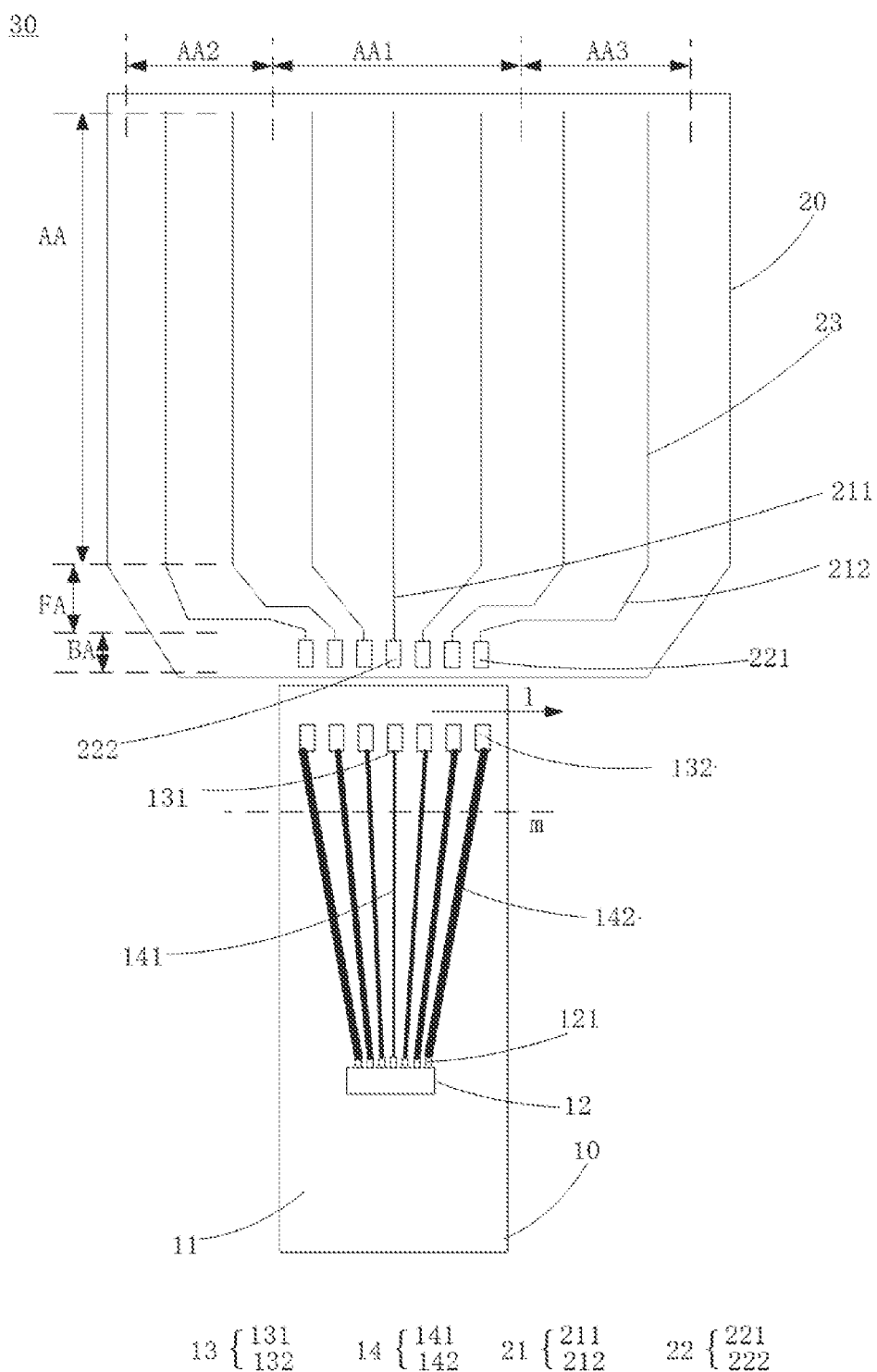
FIG. 3 is a schematic structural diagram of a display device provided by the present application.

In an embodiment, as shown in FIG. 3 and FIG. 1, the display device 30 provided by the present application includes a display panel 20 and a chip on film 10 (the state shown in FIG. 3 is that the display panel 20 is not bonded to the chip on film 10); wherein:

The display panel 20 includes a display area AA, a fan-out area FA, and a bonding area BA, data lines 23 located in the display area AA, fan-out traces 21 located in the fan-out area FA, and source conversion terminals 22 located in the bonding area BA, wherein the fan-out traces 21 include a plurality of first fan-out traces 211 located at the middle AA1 and a plurality of second fan-out traces 212 located at the opposite sides (including at least one first side AA2 and at least one second side AA3, which are at opposite sides of the middle AA1), the source conversion terminals 22 include a first source conversion terminals 221 connected to the first fan-out traces 211 and second source conversion terminals 222 connected to the second fan-out traces 212, wherein a length of each of the first fan-out traces 211 is smaller than a length of each of the second fan-out traces 212.

The chip on film 10 includes source signal lines 14 and source connection terminals 13. The source signal lines 14 include a plurality of first source signal lines 141 located at a middle A1, and a plurality of second source signal lines 141 located at opposite sides A2. The source connection terminals 13 includes first source connection terminals 131 connected to the first source signal lines 141 and second source connection terminals 132 connected to the second source signal lines 142. The first source signal lines 141 are electrically connected to the first fan-out traces 211 through the first source connection terminals 131 and the first source conversion terminals 221. The second source signal lines 142 are electrically connected to the second fan-out traces 212 through the second source connection terminals 132 and the second source conversion terminals 222.

In the reference plane m, a cross-sectional area of each of the first source signal lines 141 is smaller than the cross-sectional area of the second source signal lines 142, and the reference plane is perpendicular to the substrate and parallel to an arrangement direction 1 of the source connection terminals;

The display panel 20 and the chip on film 10 are bonded together by an anisotropic conductive adhesive (ACA).

This embodiment provides a display device, including a chip on film and a display panel, wherein the first source signal lines are connected to the first fan-out traces, and the second source signal lines are connected to the second fan-out traces, so that attenuation from the source driver chip to each data lines is substantially the same or even completely the same, which alleviates the technical problems in the prior art that charging of the pixels at different positions in the display area is different, due to difference in lengths of the fan-out traces in the fan-out area.

In an embodiment, as shown in FIG. 3, the data lines, the fan-out traces, the source switch terminals, the source signal lines, and the source connection terminals are all symmetric with respect to a center line n of the display area.

In an embodiment, as shown in FIG. 3, the display area AA is divided into a middle AA1, and at least one first side AA2 and at least one second side AA3 located at opposite sides of the middle AA1, wherein sizes and numbers of the middle AA1, the first side AA2 and the second side AA3 may be set as needed. For example, each of the regions includes only one column of pixels, or alternatively, each of the regions includes one third of the total number of the pixels of the display panel.

For convenience of the following description, the present application assigns fan-out traces connected to data lines of a same area to a corresponding area, and also, assigns source signal lines connected to the fan-out traces of a same area to a corresponding area. For example, the fan-out traces connected to the data lines located at the middle AA1 is assigned as the fan-out traces of the middle, and the source signal lines connected to the fan-out traces of the middle is assigned as the source signal lines of the middle; the fan-out traces connected to the data lines located at the first side AA2 is assigned as the fan-out traces of the first side, and the source signal lines connected to the fan-out traces of the first side is assigned as the source signal lines of the first side; and the fan-out traces connected to the data lines located at the second side AA3 is assigned as the fan-out trace of the second side, and the source signal lines connected to the fan-out traces of the second side is assigned as the source signal lines of the second side.

In an embodiment, as shown in FIG. 3, the arrangement of the fan-out traces assigned to the same area is substantially the same, and difference in lengths of the fan-out traces is not too large; while the arrangement of the fan-out traces assigned to different areas are different and the lengths of the source signal lines are different from each other. Therefore, the cross-sectional shapes of the source signal lines assigned to the same region are the same, and have areas decreasing from the sides to the middle, while the cross-sectional shapes of the source signal lines assigned to different regions are different; thus, this is conducive to adjusting the area of each of the source signal lines, thereby further adjusting its resistance.

In an embodiment, a sum of a resistance of each of the first source signal lines 141 and a resistance of each of the first fan-out traces 211 is equal to a sum of a resistance of each of the second source signal lines 142 and a resistance of each of the second fan-out traces 212.

In an embodiment, as shown in FIG. 3, a cross-sectional area of each of the first source signal lines 141 remain constant from.

In an embodiment, a cross-sectional area of each of the second source signal lines gradually decreases from one end to another end, for example, proportionally decreases.

In an embodiment, as shown in FIG. 1, in the reference plane, the cross-sectional areas of the plurality of first source signal lines are different, which gradually increase in a direction from the middle to the opposite sides.

In an embodiment, in the reference plane, the cross-sectional areas of the plurality of first source signal lines are the same.

In an embodiment, as shown in FIG. 1, in the reference plane, the cross-sectional areas of the plurality of second source signal lines are different, and gradually increase in the direction from the middle to the opposite sides.

In an embodiment, in the reference plane, the cross-sectional areas of the plurality of second source signal lines are the same.

In an embodiment, in the reference plane, a cross section of each of the first source signal lines 141 is a first rectangle, a cross section of each of the second source signal lines 142 is a second rectangle, and an area of the first rectangle is smaller than an area of the second rectangle. In this embodiment, each of the source signal lines having a rectangular cross section is used to reduce the design difficulty of the source signal lines.

In an embodiment, a length of a bottom edge of the first rectangle is smaller than a length of a bottom edge of the second rectangle, and/or a width of the first rectangle is smaller than a width of the second rectangle.

In an embodiment, in the reference plane, a cross section of each of the first source signal lines 141 is a first trapezoid, a cross section of each of the second source signal lines 142 is a second trapezoid, and the first trapezoid has an area smaller than an area of the second trapezoid.

In an embodiment, a length of a bottom edge of the first trapezoid is smaller than a length of a bottom edge of the second trapezoid, and/or a length of a top edge of the first trapezoid is smaller than a length of a top edge of the second trapezoid, and/or a height of the first trapezoid is less than a height of the second trapezoid.

In an embodiment, in the reference plane, a cross section of each of the first source signal lines 141 is a third trapezoid, a cross section of each of the second source signal lines 142 is a third rectangle, and an area of the third trapezoid is smaller than an area of the third rectangle.

In an embodiment, a half of a sum of a length of a bottom edge and a top edge of the third trapezoid is smaller than a length of a bottom edge of the third rectangle, and/or a height of the third trapezoid is smaller than a height of the third rectangle.

In an embodiment, in the reference plane, a cross section of each of the first source signal lines 141 is a first circle, a cross section of each of the second source signal lines 142 is a second circle, and an area of the first circle is smaller than an area of the second circle.

According to the above embodiment, it can be known that:

The present application provides a novel chip on film and display device, the chip on film includes a substrate; source driving chips disposed on the substrate and including source driving terminals; source connection terminals disposed in a one-to-one correspondence with the source driving terminals; and source signal lines connecting the source connection terminals and the source driving terminals, wherein the source signal lines include a plurality of first source signal lines located at a middle, and a plurality of second source signal lines located at opposite sides, wherein each of the first source signal lines has a cross-sectional area smaller than a cross-sectional area of each of the second source signal lines in a reference plane. Based on the structure, a resistance of the source signal line is greater than a resistance of the second source signal line. Accordingly, after the chip on film is bonded to the display panel to form a display module, the first source signal lines are connected to the first fan-out traces at the middle, and the second source signal lines are connected to the second fan-out traces at opposite sides, so that attenuation from the source driver chip to each data lines is substantially the same or even completely the same, which alleviates the technical problems in the prior art that charging of the pixels at different positions in the display area is different, due to difference in lengths of the fan-out traces in the fan-out area.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A chip on film, comprising:
   a substrate;
   source driving chips disposed on the substrate and comprising source driving terminals;
   source connection terminals disposed in a one-to-one correspondence with the source driving terminals; and
   source signal lines connecting the source connection terminals and the source driving terminals,
   wherein the source signal lines comprise a plurality of first source signal lines located at a middle, and a plurality of second source signal lines located at opposite sides, wherein each of the first source signal lines has a cross-sectional area smaller than a cross-sectional area of each of the second source signal lines in a reference plane, and the reference plane is perpendicular to the substrate and parallel to an arrangement direction of the source connection terminals.

2. The chip on film according to claim 1, wherein the plurality of first source signal lines have different cross-sectional areas in the reference plane, which gradually increase in a direction from the middle to the opposite sides.

3. The chip on film according to claim 1, wherein the plurality of first source signal lines have a same cross-sectional area in the reference plane.

4. The chip on film according to claim 1, wherein the plurality of second source signal lines have different cross-sectional areas in the reference plane, which gradually increase in a direction from the middle to the opposite sides.

5. The chip on film according to claim 1, wherein the plurality of second source signal lines have a same cross-sectional area in the reference plane.

6. The chip on film according to claim 1 wherein a cross-sectional area of each of the first source signal lines remain constant from its one end to another end.

7. The chip on film according to claim 1, wherein a cross-sectional area of each of the second source signal lines gradually decreases from its one end to another end.

8. The chip on film according to claim 1, wherein, in the reference plane, a cross section of each of the first source signal lines is a first rectangle, a cross section of each of the second source signal lines is a second rectangle, and an area of the first rectangle is smaller than an area of the second rectangle.

9. The chip on film according to claim 8, wherein a length of a bottom edge of the first rectangle is smaller than a length of a bottom edge of the second rectangle, and/or a width of the first rectangle is smaller than a width of the second rectangle.

10. The chip on film according to claim 1, wherein in the reference plane, a cross section of each of the first source signal lines is a first trapezoid, a cross section of each of the second source signal lines is a second trapezoid, and the first trapezoid has an area smaller than an area of the second trapezoid.

11. The chip on film according to claim 10, wherein a length of a bottom edge of the first trapezoid is smaller than a length of a bottom edge of the second trapezoid, and/or a length of a top edge of the first trapezoid is smaller than a length of a top edge of the second trapezoid, and/or a height of the first trapezoid is less than a height of the second trapezoid.

12. The chip on film according to claim 1, wherein, in the reference plane, a cross section of each of the first source signal lines is a third trapezoid, a cross section of each of the second source signal lines is a third rectangle, and an area of the third trapezoid is smaller than an area of the third rectangle.

13. The chip on film according to claim 12, wherein a half of a sum of a length of a bottom edge and a top edge of the third trapezoid is smaller than a length of a bottom edge of the third rectangle, and/or a height of the third trapezoid is smaller than a height of the third rectangle.

14. A display device, comprising: a display panel comprising fan-out traces and source conversion terminals, and the fan-out traces comprise a plurality of first fan-out traces located at a middle, and a plurality of second fan-out traces located at opposite sides, wherein the source conversion terminals comprise first source conversion terminals connected to the first fan-out traces and second source conversion terminals connected to the second fan-out traces, and a length of each of the first fan-out traces is smaller than a length of each of the second fan-out traces; a chip on film comprising source signal lines and source connection terminals, the source signal lines comprising a plurality of first source signal lines located at a middle, and a plurality of second source signal lines located at opposite sides, wherein the source connection terminals comprises first source connection terminals connected to the first source signal lines and second source connection terminals connected to the second source signal lines; the first source signal lines are electrically connected to the first fan-out traces through the first source connection terminals and the first source conversion terminals; and the second source signal lines are electrically connected to the second fan-out traces through the second source connection terminals and the second source conversion terminals, wherein each of the first source signal lines has a cross-sectional area smaller than a cross-sectional area of each of the second source signal lines in a reference plane, and the reference plane is perpendicular to a substrate and parallel to an arrangement direction of the source connection terminals.

15. The display device according to claim 14, wherein the plurality of first source signal lines have different cross-sectional areas in the reference plane, which gradually increase in a direction from the middle to the opposite sides.

16. The display device according to claim 14, wherein the plurality of first source signal lines have a same cross-sectional area in the reference plane.

17. The display device according to claim 14, wherein the plurality of second source signal lines have different cross-sectional areas in the reference plane, which gradually increase in a direction from the middle to the opposite sides.

18. The display device according to claim 14, wherein the plurality of second source signal lines have a same cross-sectional area in the reference plane.

19. The display device according to claim 14, wherein a sum of a resistance of each of the first source signal lines and a resistance of each of the first fan-out traces is equal to a sum of a resistance of each of the second source signal lines and a resistance of each of the second fan-out traces.

20. The display device according to claim 14, wherein a cross-sectional area of each of the second source signal lines gradually decreases from one end to another end.

* * * * *

UNITED STATES PATENT AND TRADEMARK OFFICE
CERTIFICATE OF CORRECTION

| | | |
|---|---|---|
| PATENT NO. | : 11,081,441 B1 | Page 1 of 1 |
| APPLICATION NO. | : 16/623800 | |
| DATED | : August 3, 2021 | |
| INVENTOR(S) | : Xiaoli Fu | |

It is certified that error appears in the above-identified patent and that said Letters Patent is hereby corrected as shown below:

On the Title Page

Insert the following:
-- (30) Foreign Application Priority Data
Nov. 14, 2019 (CN) ..................... 201911111124.6 --

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*